(12) United States Patent
Yu et al.

(10) Patent No.: US 8,778,574 B2
(45) Date of Patent: Jul. 15, 2014

(54) METHOD FOR ETCHING EUV MATERIAL LAYERS UTILIZED TO FORM A PHOTOMASK

(71) Applicants: Keven Yu, Union City, CA (US); Madhavi Chandrachood, Sunnyvale, CA (US); Amitabh Sabharwal, San Jose, CA (US); Ajay Kumar, Cupertino, CA (US)

(72) Inventors: Keven Yu, Union City, CA (US); Madhavi Chandrachood, Sunnyvale, CA (US); Amitabh Sabharwal, San Jose, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 43 days.

(21) Appl. No.: 13/750,888

(22) Filed: Jan. 25, 2013

(65) Prior Publication Data
US 2014/0154615 A1    Jun. 5, 2014

Related U.S. Application Data

(60) Provisional application No. 61/731,874, filed on Nov. 30, 2012.

(51) Int. Cl.
*G03F 7/00* (2006.01)
*G03F 1/80* (2012.01)

(52) U.S. Cl.
USPC .................................. 430/5; 216/67

(58) Field of Classification Search
CPC ..................... G03F 1/80; G03F 7/00
USPC .................. 430/5, 322, 323; 216/67
See application file for complete search history.

(56) References Cited

U.S. PATENT DOCUMENTS

| 4,058,430 A | 11/1977 | Suntola et al. |
| 4,389,973 A | 6/1983 | Suntola et al. |
| 4,413,022 A | 11/1983 | Suntola et al. |
| 4,834,831 A | 5/1989 | Nishizawa et al. |
| 4,993,357 A | 2/1991 | Scholz |
| 5,225,366 A | 7/1993 | Yoder |
| 5,272,744 A | 12/1993 | Itou et al. |
| 5,281,274 A | 1/1994 | Yoder |

(Continued)

FOREIGN PATENT DOCUMENTS

| JP | 2009212220 A | 9/2009 |
| JP | 2010109164 A | 5/2010 |
| KR | 20100035559 A | 4/2010 |
| KR | 20100038275 A | 4/2010 |

OTHER PUBLICATIONS

PCT international search report and written opinion of PCT/US2013/068462 dated Feb. 25, 2014.

*Primary Examiner* — Stephen Rosasco
(74) *Attorney, Agent, or Firm* — Patterson & Sheridan, LLP

(57) ABSTRACT

A method and apparatus for etching photomasks are provided herein. In one embodiment, a method of etching an ARC layer or an absorber layer disposed on a photomask includes transferring a film stack into an etching chamber, the film stack having an ARC layer or an absorber layer partially exposed through a patterned layer, providing a gas mixture including at least one fluorine containing gas in to a processing chamber, applying a source RF power to form a plasma from the gas mixture, applying a first type of RF bias power to the substrate for a first period of time, applying a second type of RF bias power away from the substrate for a second period of time, and etching the ARC layer or the absorber layer through the patterned layer in the presence of the plasma.

21 Claims, 4 Drawing Sheets

(56) References Cited

U.S. PATENT DOCUMENTS

| | | |
|---|---|---|
| 5,294,286 A | 3/1994 | Nishizawa et al. |
| 5,360,738 A | 11/1994 | Jones et al. |
| 5,374,570 A | 12/1994 | Nasu et al. |
| 5,441,703 A | 8/1995 | Jurgensen |
| 5,443,647 A | 8/1995 | Aucoin et al. |
| 5,480,818 A | 1/1996 | Matsumoto et al. |
| 5,483,919 A | 1/1996 | Yokoyama et al. |
| 5,503,875 A | 4/1996 | Imai et al. |
| 5,674,786 A | 10/1997 | Turner et al. |
| 5,711,811 A | 1/1998 | Suntola et al. |
| 5,796,116 A | 8/1998 | Nakata et al. |
| 5,807,792 A | 9/1998 | Ilg et al. |
| 5,835,677 A | 11/1998 | Li et al. |
| 5,855,680 A | 1/1999 | Soininen et al. |
| 5,866,795 A | 2/1999 | Wang et al. |
| 5,879,459 A | 3/1999 | Gadgil et al. |
| 5,916,365 A | 6/1999 | Sherman |
| 5,923,056 A | 7/1999 | Lee et al. |
| 6,015,590 A | 1/2000 | Suntola et al. |
| 6,015,917 A | 1/2000 | Bhandari et al. |
| 6,042,652 A | 3/2000 | Hyun et al. |
| 6,084,302 A | 7/2000 | Sandhu |
| 6,124,158 A | 9/2000 | Dautartas et al. |
| 6,139,700 A | 10/2000 | Kang et al. |
| 6,144,060 A | 11/2000 | Park et al. |
| 6,159,297 A | 12/2000 | Herchen et al. |
| 6,174,377 B1 | 1/2001 | Doering et al. |
| 6,174,809 B1 | 1/2001 | Kang et al. |
| 6,183,563 B1 | 2/2001 | Choi et al. |
| 6,197,683 B1 | 3/2001 | Kang et al. |
| 6,200,893 B1 | 3/2001 | Sneh |
| 6,203,613 B1 | 3/2001 | Gates et al. |
| 6,207,487 B1 | 3/2001 | Kim et al. |
| 6,231,672 B1 | 5/2001 | Choi et al. |
| 6,270,572 B1 | 8/2001 | Kim et al. |
| 6,284,646 B1 | 9/2001 | Leem |
| 6,287,965 B1 | 9/2001 | Kang et al. |
| 6,305,314 B1 | 10/2001 | Sneh et al. |
| 6,306,216 B1 | 10/2001 | Kim et al. |
| 6,342,277 B1 | 1/2002 | Sherman |
| 6,348,376 B2 | 2/2002 | Lim et al. |
| 6,358,629 B1 | 3/2002 | Aga |
| 6,372,598 B2 | 4/2002 | Kang et al. |
| 6,379,748 B1 | 4/2002 | Bhandari et al. |
| 6,391,785 B1 | 5/2002 | Satta et al. |
| 6,399,491 B2 | 6/2002 | Jeon et al. |
| 6,416,577 B1 | 7/2002 | Suntoloa et al. |
| 6,416,822 B1 | 7/2002 | Chiang et al. |
| 6,428,859 B1 | 8/2002 | Chiang et al. |
| 6,447,607 B2 | 9/2002 | Soininen et al. |
| 6,451,119 B2 | 9/2002 | Sneh et al. |
| 6,451,695 B2 | 9/2002 | Sneh |
| 6,475,910 B1 | 11/2002 | Sneh |
| 6,476,276 B2 | 11/2002 | Matsui et al. |
| 6,478,872 B1 | 11/2002 | Chae et al. |
| 6,481,945 B1 | 11/2002 | Hasper et al. |
| 6,482,262 B1 | 11/2002 | Elers et al. |
| 6,482,733 B2 | 11/2002 | Raaijmakers et al. |
| 6,488,924 B1 | 12/2002 | Monteleone et al. |
| 6,511,539 B1 | 1/2003 | Raaijmakers |
| 6,551,406 B2 | 4/2003 | Kilpi |
| 6,749,974 B2 | 6/2004 | Chan |
| 7,605,089 B2 | 10/2009 | Furukawa et al. |
| 7,771,895 B2 | 8/2010 | Wu et al. |
| 8,293,430 B2 | 10/2012 | Chandrachood et al. |
| 2001/0000866 A1 | 5/2001 | Sneh et al. |
| 2001/0002280 A1 | 5/2001 | Sneh |
| 2001/0009140 A1 | 7/2001 | Bondestam et al. |
| 2001/0009695 A1 | 7/2001 | Saanila et al. |
| 2001/0011526 A1 | 8/2001 | Doering et al. |
| 2001/0013312 A1 | 8/2001 | Soininen et al. |
| 2001/0014371 A1 | 8/2001 | Kilpi |
| 2001/0024387 A1 | 9/2001 | Raaijmakers et al. |
| 2001/0025979 A1 | 10/2001 | Kim et al. |
| 2001/0028924 A1 | 10/2001 | Sherman |
| 2001/0034123 A1 | 10/2001 | Jeon et al. |
| 2001/0041250 A1 | 11/2001 | Werkhoven et al. |
| 2001/0042523 A1 | 11/2001 | Kesala |
| 2001/0042799 A1 | 11/2001 | Kim et al. |
| 2001/0054377 A1 | 12/2001 | Lindfors et al. |
| 2001/0054730 A1 | 12/2001 | Kim et al. |
| 2001/0054769 A1 | 12/2001 | Raaijmakers et al. |
| 2002/0000196 A1 | 1/2002 | Park |
| 2002/0000598 A1 | 1/2002 | Kang et al. |
| 2002/0007790 A1 | 1/2002 | Park |
| 2002/0009544 A1 | 1/2002 | McFeely et al. |
| 2002/0020869 A1 | 2/2002 | Park et al. |
| 2002/0021544 A1 | 2/2002 | Cho et al. |
| 2002/0031618 A1 | 3/2002 | Sherman |
| 2002/0041931 A1 | 4/2002 | Suntola et al. |
| 2002/0048635 A1 | 4/2002 | Kim et al. |
| 2002/0052097 A1 | 5/2002 | Park |
| 2002/0066411 A1 | 6/2002 | Chiang et al. |
| 2002/0068458 A1 | 6/2002 | Chiang et al. |
| 2002/0073924 A1 | 6/2002 | Chiang et al. |
| 2002/0076481 A1 | 6/2002 | Chiang et al. |
| 2002/0076507 A1 | 6/2002 | Chiang et al. |
| 2002/0076837 A1 | 6/2002 | Hujanen et al. |
| 2002/0078508 A1 | 6/2002 | George |
| 2002/0082296 A1 | 6/2002 | Verschoor et al. |
| 2002/0086106 A1 | 7/2002 | Park et al. |
| 2002/0092471 A1 | 7/2002 | Kang et al. |
| 2002/0094689 A1 | 7/2002 | Park |
| 2002/0098627 A1 | 7/2002 | Pomarede et al. |
| 2002/0104481 A1 | 8/2002 | Chiang et al. |
| 2002/0106536 A1 | 8/2002 | Lee et al. |
| 2002/0134307 A1 | 9/2002 | Choi |
| 2002/0144655 A1 | 10/2002 | Chiang et al. |
| 2002/0144857 A1 | 10/2002 | Toyoda |
| 2002/0146511 A1 | 10/2002 | Chiang et al. |
| 2002/0155722 A1 | 10/2002 | Satta et al. |
| 2002/0162506 A1 | 11/2002 | Sneh et al. |
| 2002/0164421 A1 | 11/2002 | Chiang et al. |
| 2002/0164423 A1 | 11/2002 | Chiang et al. |
| 2002/0177282 A1 | 11/2002 | Song |
| 2002/0182320 A1 | 12/2002 | Leskela et al. |
| 2002/0187256 A1 | 12/2002 | Elers et al. |
| 2002/0197402 A1 | 12/2002 | Chiang et al. |
| 2003/0004723 A1 | 1/2003 | Chihara |
| 2003/0013320 A1 | 1/2003 | Kim et al. |
| 2003/0031807 A1 | 2/2003 | Elers et al. |
| 2003/0042630 A1 | 3/2003 | Babcoke et al. |
| 2003/0049942 A1 | 3/2003 | Haukka et al. |
| 2003/0072975 A1 | 4/2003 | Shero et al. |
| 2003/0075273 A1 | 4/2003 | Kilpela et al. |
| 2003/0075925 A1 | 4/2003 | Lindfors et al. |
| 2003/0203289 A1 | 10/2003 | Yan et al. |
| 2004/0072081 A1* | 4/2004 | Coleman et al. .............. 430/5 |
| 2005/0227152 A1 | 10/2005 | Yan et al. |
| 2008/0070128 A1 | 3/2008 | Wu et al. |
| 2012/0129083 A1* | 5/2012 | Yoshimori et al. ............ 430/5 |
| 2013/0008867 A1* | 1/2013 | Tokashiki et al. ............ 216/22 |

* cited by examiner

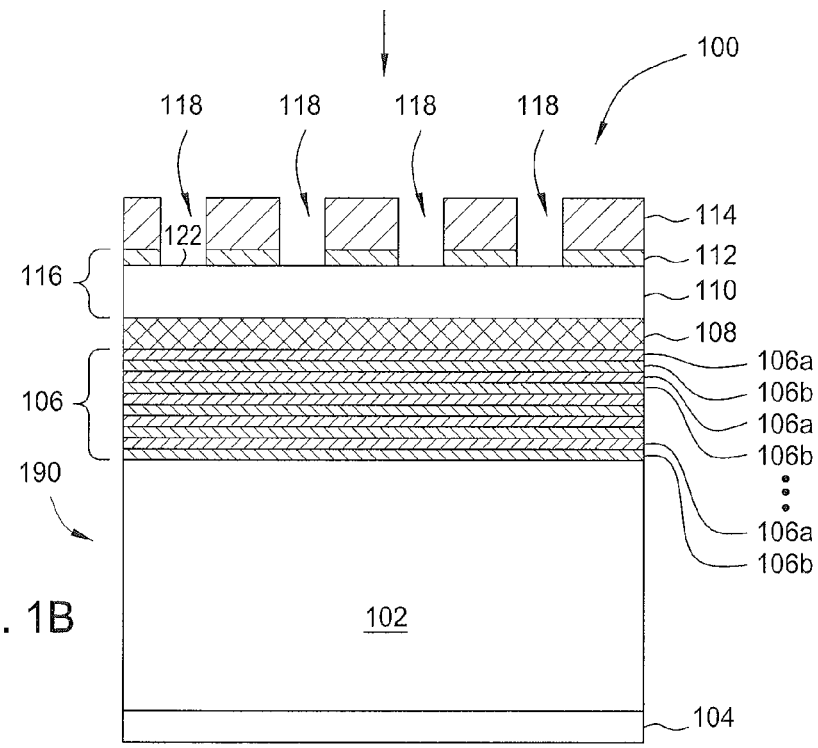
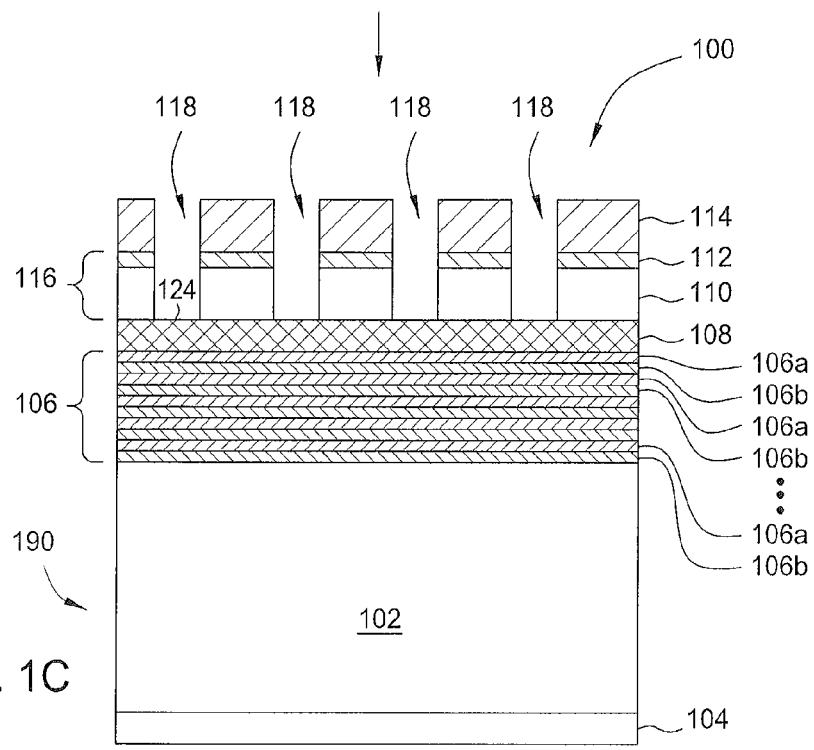

METHOD FOR ETCHING EUV MATERIAL LAYERS UTILIZED TO FORM A PHOTOMASK

CROSS-REFERENCE TO RELATED APPLICATION

This application claims benefit of U.S. Provisional Application Ser. No. 61/731,874 filed Nov. 30, 2012, which is incorporated by reference in its entirety.

BACKGROUND

1. Field

Embodiments of the present invention generally relate to a method for plasma etching extreme ultraviolet (EUV) material layers and, more specifically, to a method for etching an EUV anti-reflective coating (ARC) layer and absorber layer during photomask fabrication.

2. Description of the Related Art

In the manufacture of integrated circuits (IC), or chips, patterns representing different layers of the chip are created by a chip designer. A series of reusable masks, or photomasks, are created from these patterns in order to transfer the design of each chip layer onto a semiconductor substrate during the manufacturing process. Mask pattern generation systems use precision lasers or electron beams to image the design of each layer of the chip onto a respective mask. The masks are then used much like photographic negatives to transfer the circuit patterns for each layer onto a semiconductor substrate. These layers are built up using a sequence of processes and translate into the tiny transistors and electrical circuits that comprise each completed chip. Thus, any defects in the mask may be transferred to the chip, potentially adversely affecting performance. Defects that are severe enough may render the mask completely useless. Typically, a set of 15 to 30 masks is used to construct a chip and can be used repeatedly.

A photomask is typically a glass or a quartz substrate giving a film stack having multiple layers, including an ARC layer, an absorber layer and a capping layer disposed on other film materials, if any, thereon. When manufacturing the photomask layer, a photoresist layer is typically disposed on the film stack to facilitate transferring features into the film stack during the subsequent patterning processes. During the patterning process, the circuit design is written onto the photomask by exposing portions of the photoresist to extreme ultraviolet light or ultraviolet light, making the exposed portions soluble in a developing solution. The soluble portion of the resist is then removed, allowing the exposed underlying film stack be etched. The etch process removes the film stack from the photomask at locations where the resist was removed, i.e., the exposed film stack is removed.

With the shrinkage of critical dimensions (CD), present optical lithography is approaching a technological limit at the 45 nanometer (nm) technology node. Next generation lithography (NGL) is expected to replace the conventional optical lithography method, for example, in the 32 nm technology node and beyond. There are several NGL candidates, such as extreme ultraviolet (EUV) lithography (EUVL), electron projection lithography (EPL), ion projection lithography (IPL), nano-imprint, and X-ray lithography. Among these, EUVL is the most likely successor due to the fact that EUVL has most of the properties of optical lithography, which is more mature technology as compared with other NGL methods.

Accordingly, the film stack is being developed to have a new film scheme so as to work with the EUV technology to facilitate forming the photomask with desired features disposed thereon. The film stack may include multiple layers with different materials to be etched to form the desired features. Imprecise etch process control may result in critical dimension (CD) bias, poor critical dimension (CD) uniformity, undesired cross sectional profile and etch critical dimension (CD) linearity and unwanted defects. It is believed that EUV technology may provide good CD uniformity, less etching bias, desired linearity, less line edge roughness, and high thickness uniformity and less defectivity.

In one etch process, known as dry etching, reactive ion etching, or plasma etching, a plasma is used to enhance a chemical reaction and etch the patterned film stack of the photomask. Undesirably, conventional etch processes often exhibit etch bias due to attack on the photoresist material utilized to pattern the film stack. As the photoresist or sidewall of the film stack is attacked during the etching process, the critical dimension of patterned resist is not accurately transferred to the film stack. Thus, conventional etch processes may not produce acceptable results for photomasks having critical dimensions less than about 5 μm. This results in non-uniformity of the etched features of the photomask and correspondingly diminishes the ability to produce features for devices having small critical dimensions using the photomask. As the critical dimensions of photomask continue to shrink, the importance of etch uniformity increases. Thus, an etch process having high etch uniformity to the film stack disposed on the photomask for EUV technology is highly desirable.

Furthermore, high etching selectivity among each layers disposed in the film stack is also desired. As the material layers formed in the film stack may have similar film properties, poor selectivity often occurs while etching each layers disposed in the film stack. Poor etching selectivity may result in poor structure integrity, such as non-uniformity or tapered profile formed on the top and/or sidewall of the formed structure on the substrate, thereby eventually leading to device failure. Therefore, high selectivity of an etching process is increasingly important to preserve profiles and thickness of a photoresist layer while etching an underlying materials in the film stack or the like, disposed underneath the photoresist layer.

Thus, there is a need for an improved etch process for forming a photomask for EUV technology.

SUMMARY

Embodiments of the present invention generally provide a method and apparatus for etching photomasks for EUV technologies. Embodiments of the present invention also generally relate to photomask manufacturing technology for binary, PSM, OMOG and EUV Lithography. Embodiments of the present invention also generally relate to a method for plasma removal of ARC layer and absorber layer process for EUV applications.

In one embodiment, a method of etching an ARC layer or an absorber layer disposed on a photomask includes transferring a film stack into an etching chamber, the film stack having an ARC layer or an absorber layer partially exposed through a patterned layer, providing a gas mixture including at least one fluorine containing gas in to a processing chamber, applying a source RF power to form a plasma from the gas mixture, applying a first type of RF bias power to the substrate for a first period of time, applying a second type of RF bias power away from the substrate for a second period of time, and etching the ARC layer or the absorber layer through the patterned layer in the presence of the plasma.

In another embodiment, a method of etching an ARC layer or an absorber layer disposed on a photomask includes transferring a film stack into an etching chamber, the film stack having an ARC layer disposed on an absorber layer partially exposed through a patterned photoresist layer, providing a first gas mixture including at least one fluorine containing gas in to a processing chamber, applying a first source RF power to form a plasma from the first gas mixture to etch the ARC layer, applying a first type of RF bias power to the substrate for a first period of time, applying a second type of RF bias power away from the substrate for a second period of time, and etching the ARC layer through the patterned photoresist layer in the presence of the plasma.

In yet another embodiment, a method of etching an ARC layer and an absorber layer disposed on a photomask includes transferring a film stack into an etching chamber, the film stack having an ARC layer disposed on an absorber layer disposed therein partially exposed through a patterned photoresist layer, providing a first gas mixture including at least one fluorine containing gas in to a processing chamber, applying a first type of RF bias power to the substrate for a first period of time, applying a second type of RF bias power away from the substrate for a second period of time, etching the ARC layer through the patterned photoresist layer in the presence of the plasma, providing a second gas mixture including at least one fluorine containing gas in to the same processing chamber, applying a third type of RF bias power to the substrate for a third period of time, applying a fourth type of RF bias power away from the substrate for a fourth period of time, wherein first RF bias power is higher than the third RF bias power.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1A-1C depict one embodiment of a sequence for manufacturing an EUV photomask in accordance with one embodiment of the invention;

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention provides a method and apparatus for manufacturing a photomask substrate. More specifically, the invention relates to methods of etching of an ARC layer and an absorber layer disposed on a photomask substrate with improved etching control.

Figure 1A:
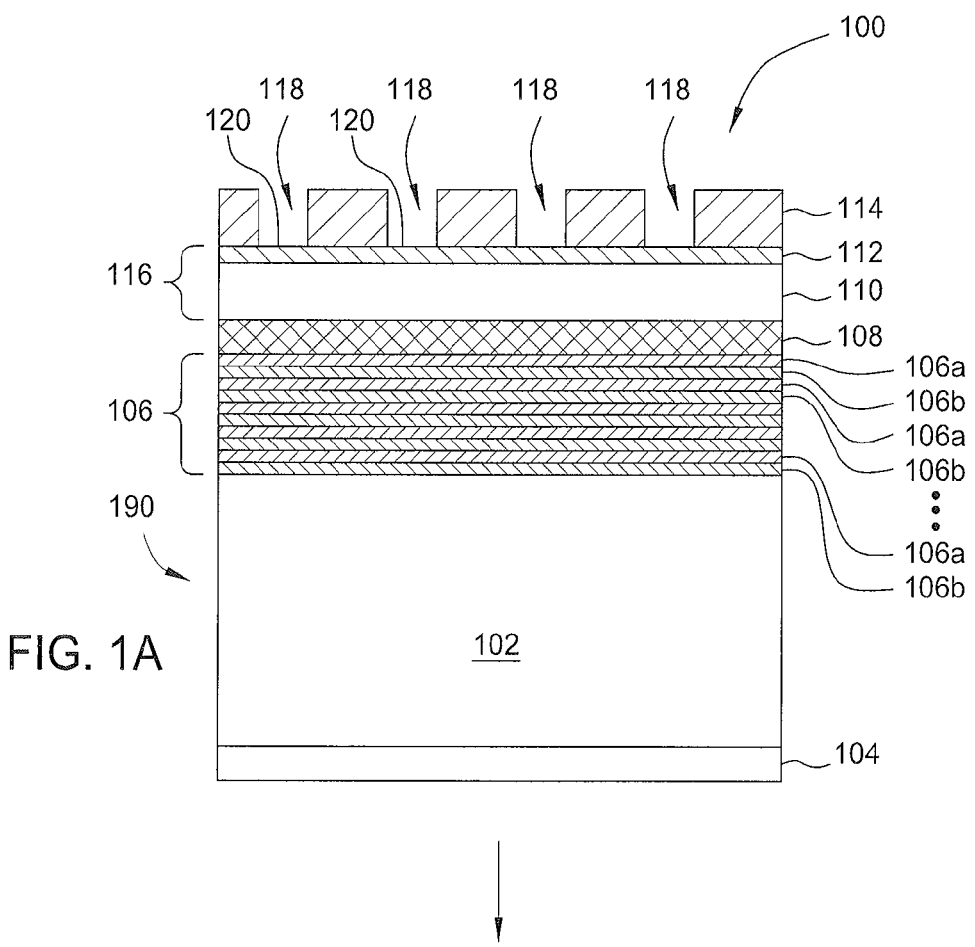

FIGS. 1A-1C depicts a process sequence for manufacturing a photomask 190. The photomask 190 includes a film stack 100 disposed on the photomask 190 that may be utilized to form desired features (such as openings 118) on the photomask 190. As the exemplary embodiment depicted in FIG. 1A, the photomask 190 may include a photomask substrate 102. The substrate 102 may be a quartz substrate (i.e., low thermal expansion silicon dioxide ($SiO_2$)) layer. The photomask substrate 102 may have a rectangular shape having sides between about 5 inches to about 9 inches in length. The photomask substrate 102 may be between about 0.15 inches and about 0.25 inches thick. In one embodiment, the photomask substrate 102 is about 0.25 inches thick. An optional chromium containing layer 104, such as a chromium nitride (CrN) layer may be disposed to a backside of the photomask substrate 102 as needed.

An EUV reflective multi-material layer 106 is disposed on the photomask substrate 102. The reflective multi-material layer 106 may include at least one molybdenum layer 106a and a silicon layer 106b. Although the embodiment depicted in FIG. 1A shows five pairs of a molybdenum layer 106a and a silicon layer 106b (alternating molybdenum layers 106a and the silicon layers 106b repeatedly formed on the photomask substrate 102), it is noted that number of molybdenum layers 106a and the silicon layers 106b may be varied based on different process needs. In one particular embodiment, forty pairs of molybdenum layers 106a and the silicon layers 106b may be deposited to form the reflective multi-material layer 106. In one embodiment, the thickness of each single molybdenum layer 106a may be controlled at between about 1 Å and about 10 Å, such as about 3 Å, and the thickness of the each single silicon layer 106b may be controlled at between about 1 Å and about 10 Å, such as about 4 Å. The reflective multi-material layer 106 may have a total thickness between about 10 Å and about 500 Å. The reflective multi-material layer 106 may have an EUV light reflectivity of up to 70% at 13.5 nm wavelength. The reflective multi-material layer 106 may have a total thickness between about 70 nm and about 140 nm.

A capping layer 108 is disposed on the reflective multi-material layer 106. The capping layer 108 may be fabricated by a metallic material, such as ruthenium (Ru) material, zirconium (Zr) material, or any other suitable material. In the embodiment depicted in FIG. 1A-1C, the capping layer 108 is a ruthenium (Ru) layer. The capping layer 108 may have a thickness between about 1 nm and about 10 nm, such as between about 2.5 nm and about 50 nm.

An absorber film stack 116 may be disposed on the capping layer 108. The absorber film stack 116 is an opaque and light-shielding layer configured to absorb portion of the light generated during the lithography process. The absorber film stack 116 may be in form of a single layer or a multi-layer structure, such as including an anti-reflective coating (ARC) layer 112 disposed on an absorber layer 110, as the embodiments depicted in FIGS. 1A-1C. In one embodiment, the absorber film stack 116 has a total film thickness between about 50 nm and about 200 nm. In one embodiment, the ARC layer 112 may have a thickness between about 3 nm an about 10 nm and the absorber layer may have a thickness between about 70 nm and about 90 nm. The total thickness of the absorber film stack 116 advantageously facilitates meeting the strict overall etch profile tolerance for EUV masks in sub-45 nm technology node applications.

In one embodiment, the absorber layer 110 may comprise tantalum-based materials with essentially no oxygen, for example tantalum silicide based materials, such as TaSi, nitrogenized tantalum boride-based materials, such as TaBN, and tantalum nitride-based materials, such as TaN. The ARC layer 112 may be fabricated from a tantalum and oxygen-based materials, such as TaN, TaON, or TaBN. In one embodiment, the composition of the ARC layer 112 corresponds to the composition of the absorber layer 110, and may comprise oxidized and nitrogenized tantalum and silicon based materials, such as TaSiON, when the absorber layer 110 comprises TaSi or TaSiN; tantalum boron oxide based materials, such as TaBO, when the absorber layer 110 comprises TaBN or TaN; and oxidized and nitrogenized tantalum-based materials, such as TaON or TaO, when the absorber layer 110 comprises TaN.

A patterned photoresist layer 114 is formed over the absorber film stack 116 having openings 118 formed therein that expose portions 120 of the absorber film stack 116 for etching. The openings 118 of the photoresist layer 114 may be patterned by a gas mixture including at least a $H_2$ gas and a $N_2$ gas. During patterning of the photoresist layer 114, a RF source power may be supplied to a coil formed in a processing chamber, such as the etch reactor 200 which will be further described below with reference to FIG. 2, with or without applying a bias RF power to etch thereof forming the openings 118 in the photoresist layer 114. The photoresist layer 114 may comprise any suitable photosensitive resist materials, such as an e-beam resist (for example, a chemically amplified resist (CAR)), and deposited and patterned in any suitable manner. The photoresist layer may be deposited to a thickness between about 100 nm and about 1000 nm.

The photomask substrate 102 is transferred to an etching processing chamber, such as the etch reactor 200 to perform an etching process. The etching process is performed to etch the absorber film stack 116 and/or optionally the capping layer 108 exposed through the opening 118 defined by the photoresist layer 114. The etching process is performed to etch the ARC layer 112 and the absorber layer 110 until the underlying surface 122, 124 of the absorber layer 110 and the capping layer 108 are sequentially exposed, as shown in FIGS. 1B and 1C. The ARC layer 112 and the absorber layer 110 may be continuously etched using one process step, such as a single etchant chemistry, or separately etched by multiple steps in one or different etching processing chambers as needed. In one exemplary embodiment, the etching process for etching the ARC layer 112 and the absorber layer 110 described herein is performed in a single chamber using multiple steps. The patterns from the photoresist layer 114 are transferred into the absorber film stack 116 through the etching process. As the ARC layer 112 and the absorber layer 110 fabricated from similar materials, the etching gas mixture is configured to have high etching capability to etch different materials with similar properties as well as maintaining high selectivity to the underlying capping layer 108 so as to maintain desired sidewall profiles. Details of the etching process for the ARC layer 112 and the absorber layer 110 will be further described below with reference to FIG. 3.

Subsequently, a reflective multi-material layer etching process is performed to etch the reflective multi-material layer 106 as need to complete the feature transfer process to transfer features into the film stack 100.

Figure 2:
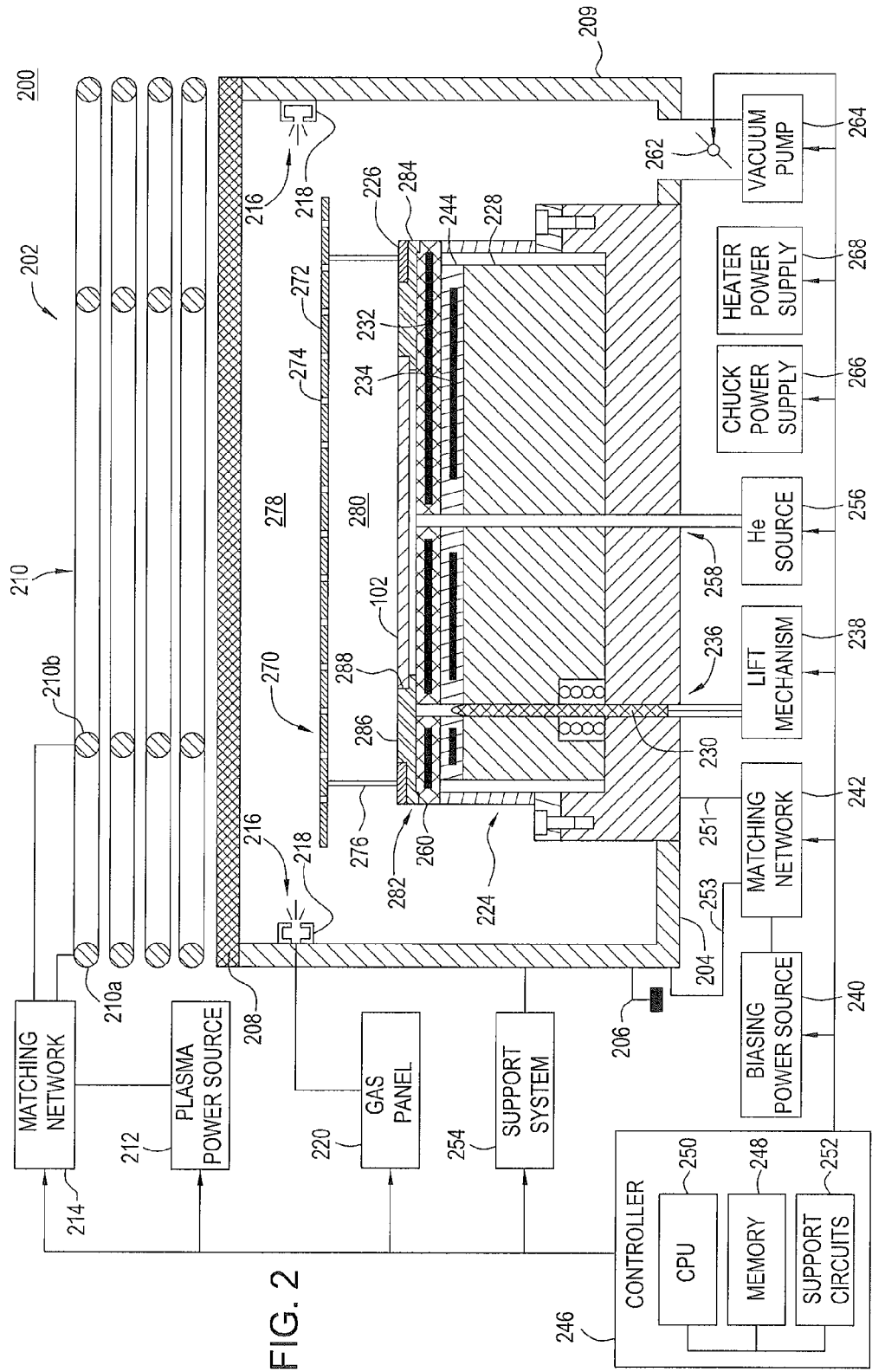
FIG. 2 depicts a schematic cross-sectional view of a processing chamber that may be utilized to fabricate a photomask in accordance with one embodiment of the present invention.

FIG. 2 depicts a schematic diagram of an etch reactor 200. Suitable reactors that may be adapted for use with the teachings disclosed herein include, for example, the Decoupled Plasma Source (DP$^S$®) II reactor, or the Tetra I, Tetra II, Tetra X Photomask etch systems, all of which are available from Applied Materials, Inc. of Santa Clara, Calif. The particular embodiment of the reactor 200 shown herein is provided for illustrative purposes and should not be used to limit the scope of the invention. It is contemplated that the invention may be utilized in other plasma processing chambers, including those from other manufacturers.

The reactor 200 generally comprises a processing chamber 202 having a substrate pedestal 224 within a conductive body, and a controller 246. The conductive body includes a chamber wall 209 and a bottom 204 enclosed by a flat dielectric ceiling or lid 208. The chamber 202 may have other types of ceilings, e.g., a dome-shaped ceiling. The chamber 202 may be coupled to ground 206 through the chamber wall 209.

An antenna 210 is disposed above the ceiling 208 and comprises one or more inductive coil elements that may be selectively controlled (two co-axial elements 210a and 210b are shown in FIG. 2). The antenna 210 is coupled through a first matching network 214 to a plasma power source 212, which is typically capable of producing up to about 3000 W at a tunable frequency in a range from about 100 Hz to about 50 kHz, such as about 13.56 MHz.

The substrate pedestal (cathode) 224 is coupled through a second matching network 242 through a first connecting line 251 to a biasing power source 240. The second network 242 may further coupled to the chamber wall 209 to ground 206 through a second connecting line 253. The bias power supplied from the biasing power source 204 to the chamber wall 209 to ground 206 compared to the bias power supplied to the substrate pedestal (cathode) 224 may be configured substantially the same, similar, or different as needed to meet different process requirements. The biasing power source 240 generally is a source of up to about 500 W at a frequency of between about 100 KHz and about 60 MHz, such as approximately 13.56 MHz, that is capable of producing either continuous or pulsed bias power. Alternatively, the biasing power source 240 may be a DC or pulsed DC source. In some cases wherein a bias power is not needed, the biasing power source 240 may also be grounded through the second matching network 242 to ground 206 by the chamber wall 209.

In one embodiment, the substrate support pedestal 224 comprises an electrostatic chuck 260, which has at least one clamping electrode 232 and is controlled by a chuck power supply 266. In alternative embodiments, the substrate pedestal 224 may comprise substrate retention mechanisms such as a susceptor clamp ring, a mechanical chuck, and the like.

A reticle adapter 282 is used to secure the substrate (e.g., photomask or reticle), such as the substrate 102 depicted in FIGS. 1A-1C, onto the substrate support pedestal 224. The reticle adapter 282 generally includes a lower portion 284 that covers an upper surface of the pedestal 224 (for example, the electrostatic chuck 260) and a top portion 286 having an opening 288 that is sized and shaped to hold the substrate 102. The opening 288 is generally substantially centered with respect to the pedestal 224. The adapter 282 is generally formed from a single piece of etch resistant, high temperature resistant material such as polyimide ceramic or quartz. An edge ring 226 may cover and/or secure the adapter 282 to the pedestal 224.

A lift mechanism 238 is used to lower or raise the adapter 282 and the substrate 102 onto or off of the substrate support pedestal 224. The lift mechanism 238 comprises a plurality of lift pins 230 (one lift pin is shown) that travel through respective guide holes 236.

A gas panel 220 is coupled to the processing chamber 202 to provide process and/or other gases to the interior of the processing chamber 202. In the embodiment depicted in FIG. 2, the gas panel 220 is coupled to one or more inlets 216 formed in a channel 218 in the sidewall 204 of the chamber 202. It is contemplated that the one or more inlets 216 may be provided in other locations, for example, in the ceiling 208 of the processing chamber 202.

In one embodiment, the gas panel 220 is adapted to provide fluorinated process gas through the inlets 216 and into the interior of the body of the processing chamber 202. During processing, a plasma is formed from the process gas and maintained through inductive coupling of power from the plasma power source 212. The plasma may alternatively be formed remotely or ignited by other methods. In one embodiment, the process gas provided from the gas panel 220 includes at least a fluorinated gas and a carbon containing gas, an oxygen gas, and an chlorine containing gas. Examples of fluorinated and carbon containing gases include $CHF_3$ and $CF_4$. Other fluorinated gases may include one or more of $C_2H_2F_2$, $C_2F$, $C_2F_6$, $C_4F_6$, $C_4F_8$, $C_3F_8$, $SF_6$ and $C_6F_8$. Examples of the oxygen containing gas include $O_2$, $CO_2$, $CO$, $N_2O$, $NO_2$, $O_3$, $H_2O$, and the like. Examples of the chlorine containing gas include $Cl_2$, $CCl_4$, $CHCl_3$, $CH_2Cl_2$, $CH_3Cl$, and the like.

The pressure in the processing chamber 202 is controlled using a throttle valve 262 and a vacuum pump 264. The vacuum pump 264 and throttle valve 262 are capable of maintaining chamber pressures in the range of about 0.2 to about 20 mTorr.

In operation, the temperature of the substrate 102 is controlled by stabilizing the temperature of the substrate pedestal 224. In one embodiment, the substrate support pedestal 224 comprises a resistive heater 244 and a heat sink 228. The resistive heater 244 generally comprises at least one heating element 234 and is regulated by a heater power supply 268.

An optional ion-radical shield 270 is disposed in the chamber 202 above the pedestal 224. The ion-radical shield 270 is electrically isolated from the chamber sidewalls 204 and the pedestal 224 such that no ground path from the plate to ground is provided. One embodiment of the ion-radical shield 270 comprises a substantially flat plate 272 and a plurality of legs 276 supporting the plate 272. The plate 272, which may be made of a variety of materials compatible with process needs, comprises one or more openings (apertures) 274 that define a desired open area in the plate 272. This open area controls the amount of ions that pass from a plasma formed in an upper process volume 278 of the processing chamber 202 to a lower process volume 280 located between the ion-radical shield 270 and the substrate 102. The greater the open area, the more ions can pass through the ion-radical shield 270. As such, the size of the apertures 274 controls the ion density in volume 280, and the shield 270 serves as an ion filter. The plate 272 may also comprise a screen or a mesh wherein the open area of the screen or mesh corresponds to the desired open area provided by apertures 274. Alternatively, a combination of a plate and screen or mesh may also be used.

During processing, a potential develops on the surface of the plate 272 as a result of electron bombardment from the plasma. The potential attracts ions from the plasma, effectively filtering them from the plasma, while allowing neutral species, e.g., radicals, to pass through the apertures 274 of the plate 272. Thus, by reducing the amount of ions through the ion-radical shield 270, etching of the mask by neutral species or radicals can proceed in a more controlled manner. This reduces erosion of the resist as well as sputtering of the resist onto the sidewalls of the patterned material layer, thus resulting in improved etch bias and critical dimension uniformity.

Figure 3:
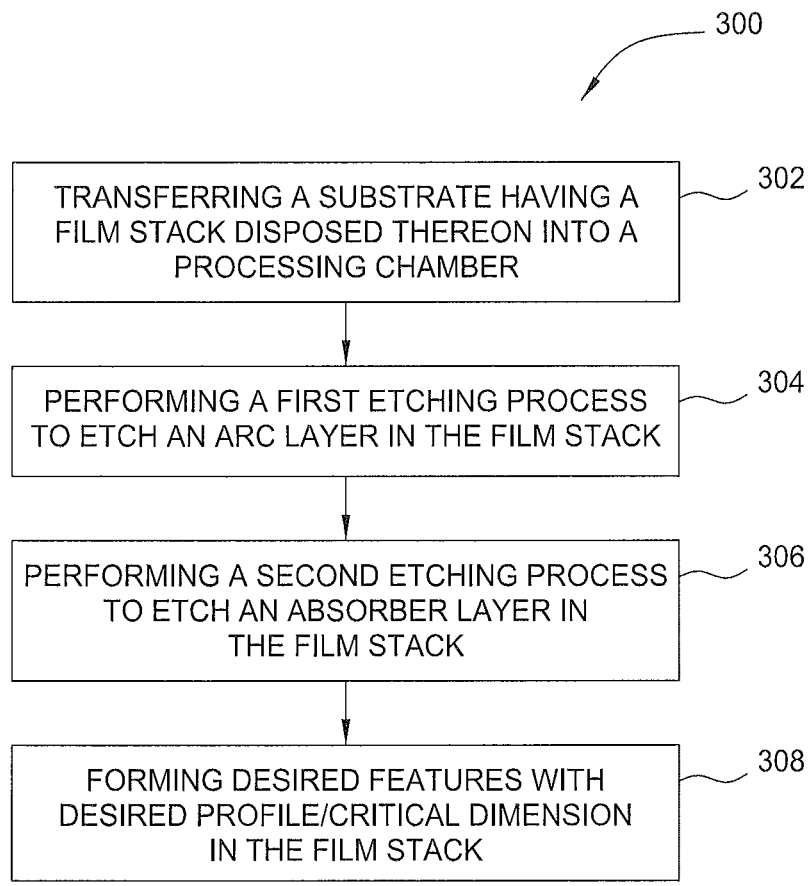
FIG. 3 depicts a flow diagram of a method for manufacturing a photomask in accordance with one embodiment of the present invention.

FIG. 3 is a flow diagram of one embodiment of a method 300 for etching an ARC layer and an absorber layer formed in a film stack disposed on a photomask, such as the ARC layer 112 and the absorber layer 110 of the film stack 100 depicted in FIGS. 1A-1C. Although the method 300 is described below with reference to a substrate utilized to fabricate a photomask, the method 300 may also be used to advantage in other photomask etching or any etching applications.

The method 300, which may be stored in computer readable form in the memory 248 of the controller 246 or other storage medium, begins at block 302 when the photomask substrate 102 is transferred to and placed on a support pedestal 224 disposed in an etch reactor, such as the etch reactor 200 depicted in FIG. 2. In one embodiment, the photomask substrate 102 rests in the opening 288 of the adapter 282. The photomask substrate 102, as described above, includes an optically transparent silicon based material, such as quartz (i.e., silicon dioxide ($SiO_2$)) layer having the ARC layer 112 and the absorber layer 110 disposed thereon having portions 120 of ARC layer 112 exposed by the patterned photoresist layer for etching, as shown in FIG. 1A. The patterned photoresist layer 114 may serve as a mask layer to protect some portion of the ARC layer 112 from being etched during the ARC layer etching process. As discussed above, as the ARC layer 112 may have similar film properties to the absorber layer 110, the process of etching the ARC layer requires to have high selectivity attacking sidewalls of the ARC layer 112 defined by the patterned photoresist layer 114 during etching. Therefore, well selected process parameters along with a gas mixture are chosen to etch the ARC layer 112 and the absorber layer 110 that has high capability for etching both ARC layer 112 and later the absorber layer 110 while having high selectivity to the exposed sidewalls and the underlying capping layer 108.

At block 304, a first etching process is performed to etch the ARC layer 112, as shown in FIG. 1B. In one embodiment, a first etching gas mixture is supplied into the etch reactor to etch the portions 120 of the ARC layer 112 exposed by the patterned photoresist layer 114 until the underlying absorber layer 110 is exposed.

In one embodiment, the first etching gas mixture includes at least a fluorine containing gas, a chlorine containing gas and/or a bromide containing gas or other suitable aggressive etchants. Suitable examples of the fluorine containing gas includes $CF_4$, $CHF_3$, $CH_2F_2$, $C_2F_6$, $C_2F_8$, $SF_6$, $NF_3$ $C_4F_8$ and the like. Examples of the chlorine-containing gas include $Cl_2$, HCl, $SiCl_4$, $BCl_3$, $CCl_4$, $CHCl_3$, $CH_2Cl_2$, $CH_3Cl$, combinations thereof and the like. Examples of the bromide containing gas include HBr, $Br_2$, combinations thereof, and the like. As the fluorine element is an aggressive etchant, the fluorine containing gas supplied in the etching gas mixture is utilized to etch away portions of the ARC layer 112, to transfer desired features from the photoresist layer 114 into the ARC layer 112.

In an alternative embodiment, an oxygen containing gas, such as $O_2$, $N_2$, $N_2O$, $NO_2$, $H_2O$, $O_3$, or the like, and an inert gas may also be supplied into the etching gas mixture to assist the profile control as needed. Examples of the inert gas supplied in the gas mixture include Ar, He, Ne, Kr, Xe or the like.

In one particular embodiment, the first gas mixture may include $C_4F_8$, $C_4F_8$, and He. In an exemplary embodiment, the fluorine containing gas and the inert gas is supplied in the etching gas mixture at a ratio by flow volume between about 5 percent and about 80 percent. Alternatively, the fluorine containing gas may be supplied at a flow rate by volume between about 1 sccm and about 200 sccm. The He gas may be supplied at a flow rate between about 2 sccm and about 150 sccm.

After the first etching gas mixture is supplied into the processing chamber, a RF power is supplied to form a plasma from the first gas mixture therein. The RF source power may be supplied at the first etching gas mixture between about 50 Watts and about 3000 Watts and at a frequency between about 100 KHz and about 60 MHz, such as about 13.56 MHz.

A bias power may also be supplied to control of the direction of the plasma generated in the processing chamber so as to control vertical trajectory of the ions in the plasma. The bias power may be supplied at between about 5 Watts and about 500 Watts. In one embodiment, the RF bias power may be pulsed with a duty cycle between about 10 to about 90 percent at a RF frequency between about 500 Hz and about 10 kHz.

In order to provide good control of the feature profile and critical dimension during etching, the bias power as applied may be controlled in a manner to reduce micro-loading effect to the substrate. During processing, electrostatic charge may accumulate on the substrate surface. Excess accumulated charge on the substrate surface may result in non-uniform plasma distribution across the substrate surface, thereby resulting in non-uniform etching results on the substrate surface. Furthermore, excess charge accumulated on the substrate may also result in arcing at certain times during the etching process, which may not only cause damage to the substrate, but also cause damage to the chamber components which may adversely shorten the life of the chamber component. Therefore, a plurality of bias power pulses applying to different components of the chamber may be utilized to efficiently reduce charge accumulation.

In one embodiment, at least two types of the bias power are applied to the processing chamber during the first etching process. In an initial stage of the etching process, a first type bias power supplied to the substrate pedestal 224, e.g, close to the substrate, is utilized to direct ions generated in the plasma in a direction toward the substrate surface so as to produce an anisotropic etching process. After the etching process is performed for a first period of time, electrostatic charge may be generated and accumulated on the substrate surface. Accordingly, a second type of bias power, a bias power applied through the chamber wall 209 to ground 206, e.g, away from the substrate, may be utilized for a second period of time to assist remove charge accumulated away from the substrate pedestal 224, thereby reducing charge accumulation on the substrate surface. Both the first type and the second type of the RF bias powers may be applied to the processing chamber in pulse mode or continuous mode. In one embodiment, the first type and the second type of the RF bias power are applied to the processing chamber in pulse mode. The plurality of RF bias power may be pulsed with a duty cycle between about 10 to about 90 percent at a RF frequency between about 100 KHz and about 60 MHz, such as about 13.56 MHz.

By utilizing a plurality of bias powers applied to different chamber components, electrostatic charge generated during the plasma etching process may be efficiently directed away from the substrate surface, thereby reducing likelihood of damage to both the substrate and the chamber components, e.g., process kits. In one embodiment, the first type of bias power, e.g, a bias power supplied to the substrate pedestal, may be applied and pulsed for the first period of time between about 50 nano seconds and about 1000 nano seconds. Subsequently, the second type of the bias power, e.g, a bias power supplied through the chamber wall to ground, may be applied and pulsed for the second period of time between about 50 nano seconds and about 1000 nano seconds. In one embodiment, a ratio of the first period of time and the second period of time is controlled between about 1:9 and about 4:1. The first type and the second type of the RF bias power may be repeatedly and alternatively performed until the ARC layer 112 is etched away from the substrate 102 exposing the underlying absorber layer 110, as shown in FIG. 1B.

In one embodiment, the first type of the RF power as pulsed may be controlled between about 5 Watts and about 600 Watts and the second type of the RF power as pulsed may be controlled between about 5 Watts and about 600 Watts.

Several process parameters may also be controlled while supplying the first etching gas mixture to perform the etching process. The pressure of the processing chamber may be controlled at between about 0.2 milliTorr and about 20 milliTorr.

At block 306, a second etching process is performed to etch the absorber layer 110, as shown in FIG. 10. In one embodiment, a second etching gas mixture is supplied into the etch reactor to etch the portions 122 of the absorber layer 110 exposed by the patterned photoresist layer 114 until the underlying capping layer 108 is exposed.

In one embodiment, the second etching gas mixture includes at least a fluorine containing gas, a chlorine containing gas and/or a bromide containing gas or other suitable aggressive etchants. Suitable examples of the fluorine containing gas includes $CF_4$, $CHF_3$, $CH_2F_2$, $C_2F_6$, $C_4F_8$, $SF_6$, $NF_3$ and the like. Examples of the chlorine-containing gas include $Cl_2$, HCl, $SiCl_4$, $BCl_3$, $CCl_4$, $CHCl_3$, $CH_2Cl_2$, $CH_3Cl$, combinations thereof and the like. Examples of the bromide containing gas include HBr, $Br_2$, combinations thereof, and the like. As the fluorine element is an aggressive etchant, the fluorine containing gas supplied in the etching gas mixture is utilized to etch away portions of the absorber layer 110 to form desired features into the absorber layer 110.

In an alternative embodiment, an oxygen containing gas, such as $O_2$, $N_2$, $N_2O$, $NO_2$, $H_2O$, $O_3$, or the like, and an inert gas may also be supplied with the etching gas mixture to assist the profile control as needed. Examples of the inert gas supplied in the gas mixture include Ar, He, Ne, Kr, Xe or the like.

In one particular embodiment, the second gas mixture may include $Cl_2$. In an exemplary embodiment, the chlorine containing gas and the inert gas is supplied in the second etching gas mixture at a ratio by flow volume between about 5 percent and about 80 percent. Alternatively, the fluorine containing gas may be supplied at a flow rate by volume between about 10 sccm and about 200 sccm. The inert gas may be supplied at a flow rate between about 2 sccm and about 150 sccm.

After the second etching gas mixture is supplied into the processing chamber, a RF source power is supplied to form a plasma from the second gas mixture therein. The RF source power may be supplied at the second etching gas mixture between about 5 Watts and about 200 Watts and at a frequency between about 100 KHz and about 60 MHz, such as about 13.56 MHz.

A bias power may also be supplied to control of the direction of the plasma generated in the processing chamber so as to control vertical trajectory of the ions in the plasma. The bias power may be supplied at between about 10 Watts and about 500 Watts. In one embodiment, the RF bias power may be pulsed with a duty cycle between about 10 to about 90 percent a frequency between about 100 KHz and about 60 MHz, such as about 13.56 MHz.

Similar to the description above at block 304 for etching the ARC layer 112, when etching the absorber layer 110, electrostatic charge may also accumulate on the substrate surface during processing. Therefore, a plurality of bias power pulses applied to different components of the chamber may be utilized to efficiently reduce charge accumulation during the absorber layer etching process at block 306.

In one embodiment, at least two types of the bias power are applied to the processing chamber during the second etching process. In the initial stage of the etching process, a third type bias power, a bias power supplied to the substrate pedestal 224 similar to the first type of bias power at block 304, e.g, close to the substrate, is utilized to direct ions generated in the plasma in a direction toward the substrate surface so as to produce an anisotropic etching process. After the etching process is performed for a third period of time, electrostatic charge may be accumulated on the substrate surface. Accordingly, a fourth type of bias power, a bias power applied through the chamber wall 209 to ground 206 similar to the second type of bias power at block 304, e.g, away from the substrate, may be utilized for a fourth period of time to assist removal of accumulated charge away from the substrate pedestal 224, thereby reducing charge accumulation on the substrate surface. Both the third type and the fourth type of the RF bias powers may be applied to the processing chamber in pulse mode or continuous mode. In one embodiment, the third type and the fourth type of the RF bias power are applied to the processing chamber in pulse mode. The plurality of RF bias power may be pulsed with a duty cycle between about 10 to about 90 percent at a frequency between about 100 KHz and about 60 MHz, such as about 13.56 MHz.

By utilizing a plurality of bias powers applied to different chamber components, electrostatic charge generated during the plasma etching process may be efficiently directed away from the substrate surface, thereby reducing likelihood of damage to both the substrate and the chamber components, e.g., process kits. In one embodiment, the third type of bias power, e.g. a bias power applied to the substrate pedestal, may be applied and pulsed for the third period of time between about 50 nano seconds and about 1000 nano seconds. Subsequently, the fourth type of the bias power, e.g. a bias power supplied through the chamber wall to ground, may be applied and pulsed for the fourth period of time between about 50 nano seconds and about 1000 nano seconds. In one embodiment, a ratio of the third period of time and the fourth period of time is controlled between about 1:9 and about 4:1. The third type and the fourth type of the RF bias power may be repeatedly and alternatively performed until the absorber layer 110 is etched away from the substrate 102 exposing the underlying capping layer 108, as shown in FIG. 10.

In one embodiment, the third type of the RF power as pulsed may be controlled between about 5 Watts and about 600 Watts and the fourth type of the RF power as pulsed may be controlled between about 5 Watts and about 600 Watts.

Several process parameters may also be controlled while supplying the second etching gas mixture to perform the etching process. The pressure of the processing chamber may be controlled at between about 0.2 milliTorr and about 20 milliTorr.

The third and the fourth bias power applied during etching of the absorber layer 110 at block 306 is controlled to be relatively high, as compared to the first and the second bias power applied during etching of the ARC layer 112 at block 304. In a particular embodiment when the absorber layer 110 and the ARC layer 112 is configured to be both etched in a single processing chamber, the endpoint for etching the ARC layer 112 (e.g., prior to etching the absorber layer 110) is not as critical as compared to the endpoint for etching the absorber layer (e.g., prior to etching the capping layer 108). Thus, in this case, a higher RF bias power may be utilized to etch the ARC layer 112 so as to enhance a processing etch rate to increase process throughput. After the ARC layer 112 is etched away, then a relatively lower RF bias power may be utilized to etch the absorber layer 110 with less ion bombardment so as to provide a gentle etching process with high selectivity to the underlying capping layer 108. In one embodiment, the third and the fourth bias power applied during etching of the ARC layer 112 at block 304 is controlled to be about 50 percent and about 200 percent lower than the first and the second bias power applied during etching of the absorber layer 110 at block 306.

The end point of the etching process at both blocks 304 and 306 may be controlled by time mode or other suitable methods. For example, the etching process at both blocks 304 and 306 may be terminated after performing between about 50 seconds and about 500 seconds until the ARC layer 112 and the absorber layer 110 are respectively removed from the photomask substrate 102, or the underlying surface of the capping layer 108 is exposed. In another embodiment, the etching process may be terminated by determination from an endpoint detector, such as an OES detector or other suitable detector as needed.

At block 308, after the desired profile and/or the structure of the film stack 100 is formed on the photomask substrate 102, the photoresist layer 114 may be removed accordingly. In one embodiment, the remaining resist and protective layer is removed by ashing. The removal process may be performed in-situ the etch reactor 200 in which the etching process performed at blocks 302-306 were performed. In the embodiment wherein the photoresist layer 114 is consumed and used up during the etching process, the ashing or photoresist layer removal process may be eliminated as needed.

Thus, methods for etching a ARC layer and an absorber layer are provided that advantageously improves trench attributes and profile with high selectivity over conventional processes. Accordingly, the method of etching an ARC layer and an absorber layer described herein advantageously facilitates fabrication of photomasks suitable for patterning features having small critical dimensions in EUV technologies.

While the foregoing is directed to embodiments of the present invention, other and further embodiments of the invention may be devised without departing from the basic scope thereof, and the scope thereof is determined by the claims that follow.

The invention claimed is:

1. A method of etching an ARC layer or an absorber layer disposed on a photomask, comprising:
   transferring a film stack into an etching chamber, the film stack having an ARC layer or an absorber layer partially exposed through a patterned layer;
   providing a gas mixture including at least one fluorine containing gas in to a processing chamber;
   applying a source RF power to form a plasma from the gas mixture;
   applying a first type of RF bias power to the substrate for a first period of time;
   applying a second type of RF bias power away from the substrate for a second period of time; and
   etching the ARC layer or the absorber layer through the patterned layer in the presence of the plasma.

2. The method of claim 1, wherein ARC layer or an absorber includes at least one of a tantalum containing layer.

3. The method of claim 1, wherein the substrate including the ARC layer disposed on the absorber layer.

4. The method of claim 1, wherein applying the first type of RF bias power comprises:
   applying the first type of RF bias power to a substrate support disposed in the processing chamber.

5. The method of claim 1, wherein applying the second type of RF bias power comprises:

applying the second type of RF bias power through a chamber wall of the processing chamber to ground.

6. The method of claim 1, wherein a time period ratio of the first period of time to the second period of time is controlled at a ratio between about 1:9 and about 4:1.

7. The method of claim 1, wherein the first and the second type of the RF bias power is applied in pulsed mode.

8. The method of claim 1, wherein the absorber layer is a TaN layer or TaBN layer and the ARC layer is a TaO or TaBO layer.

9. The method of claim 1, wherein applying the source RF power further comprises:
providing a plasma source power of between about 50 Watts to about 3000 Watts.

10. The method of claim 1, wherein applying the first type of RF bias power further comprises:
providing a first plasma bias power of between about 5 and about 600 Watts.

11. The method of claim 1, wherein applying the second type of RF bias power further comprises:
providing a second plasma bias power of between about 5 and about 600 Watts.

12. A method of etching an ARC layer or an absorber layer disposed on a photomask, comprising:
transferring a film stack into an etching chamber, the film stack having an ARC layer disposed on an absorber layer partially exposed through a patterned photoresist layer;
providing a first gas mixture including at least one fluorine containing gas in to a processing chamber;
applying a first source RF power to form a plasma from the first gas mixture to etch the ARC layer;
applying a first type of RF bias power to the substrate for a first period of time;
applying a second type of RF bias power away from the substrate for a second period of time; and
etching the ARC layer through the patterned photoresist layer in the presence of the plasma.

13. The method of claim 12, further comprising:
providing a second gas mixture including at least one chlorine containing gas in to the processing chamber;
applying a second source RF power to form a plasma from the first gas mixture to etch the ARC layer;
applying a third type of RF bias power to the substrate for a third period of time;
applying a fourth type of RF bias power away from the substrate for a fourth of time; and etching the absorber layer through the patterned photoresist and ARC layer in the presence of the plasma.

14. The method of claim 13, wherein the first RF bias power is higher than the third RF bias power.

15. The method of claim 13, wherein the first RF bias power is higher than the third RF bias power between about 50 percent and about 200 percent.

16. The method of claim 12, wherein the first period of time to the second period of time is controlled at a ratio between about 1:9 and about 4:1.

17. The method of claim 13, wherein the third period of time to the fourth period of time is controlled at a ratio between about 1:9 and about 4:1.

18. The method of claim 12, wherein the first type of RF bias power is applied to a substrate support disposed in the processing chamber and the second type of RF bias power is applied through a chamber wall of the processing chamber to ground.

19. The method of claim 13, wherein the third type of RF bias power is applied to a substrate support disposed in the processing chamber and the fourth type of RF bias power is applied through a chamber wall of the processing chamber to ground.

20. The method of claim 12, wherein the film stack further includes a capping disposed on a multiple reflective material layers disposed between the substrate and the absorber layer.

21. A method of etching an ARC layer and an absorber layer disposed on a photomask, comprising:
transferring a film stack into an etching chamber, the film stack having an ARC layer disposed on an absorber layer partially exposed through a patterned photoresist layer;
providing a first gas mixture including at least one fluorine containing gas in to a processing chamber;
applying a first type of RF bias power to the substrate for a first period of time;
applying a second type of RF bias power away from the substrate for a second period of time;
etching the ARC layer through the patterned photoresist layer in the presence of the plasma;
providing a second gas mixture including at least one fluorine containing gas in to the same processing chamber;
applying a third type of RF bias power to the substrate for a third period of time;
applying a fourth type of RF bias power away from the substrate for a fourth period of time, wherein first RF bias power is higher than the third RF bias power.

* * * * *

UNITED STATES PATENT AND TRADEMARK OFFICE
CERTIFICATE OF CORRECTION

PATENT NO. : 8,778,574 B2
APPLICATION NO. : 13/750888
DATED : July 15, 2014
INVENTOR(S) : Yu et al.

It is certified that error appears in the above-identified patent and that said Letters Patent is hereby corrected as shown below:

In the Specification:

Column 1, Line 59, please delete "(EUV)";

Column 1, Line 63, please insert -- a -- after is;

Column 1, Line 64, please delete "as compared" and insert -- compared to -- therefor;

Column 2, Lines 3-4, please delete "critical dimension (CD)" and insert -- CD -- therefor;

Column 2, Line 4, please delete "critical dimension (CD)" and insert -- CD -- therefor;

Column 2, Lines 5-6, please delete "critical dimension (CD)" and insert -- CD -- therefor;

Column 2, Line 9, please delete "defectivity" and insert -- defects -- therefor;

Column 2, Line 21, please delete "critical dimensions" and insert -- CDs -- therefor;

Column 2, Line 25, please delete "critical dimensions of photomask" and insert
-- CDs of photomasks -- therefor;

Column 2, Line 35, please insert -- a -- after or;

Column 2, Line 52, please delete "PSM, OMOG and EUV Lithography" and insert -- phase shift mask, opaque MoSi on glass, and EUV lithography -- therefor;

Column 2, Line 62, please delete "source RF power" and insert -- RF power source -- therefor;

Column 3, Line 44, please delete "depict" and insert -- depicts -- therefor;

Signed and Sealed this
Thirty-first Day of March, 2015

Michelle K. Lee
*Director of the United States Patent and Trademark Office*

CERTIFICATE OF CORRECTION (continued)
U.S. Pat. No. 8,778,574 B2

Column 4, Line 28, please insert -- a -- after that;

Column 5, Line 43, please delete "be continuously" and insert -- continuously be -- therefor;

Column 7, Line 6, please delete "gas" and insert -- gases -- therefor;

Column 9, Line 50, please delete "power" and insert -- powers -- therefor;

Column 9, Line 56, please insert -- the -- after reducing;

Column 10, Line 15, please delete "FIG. 10" and insert -- FIG. 1C -- therefor;

Column 11, Line 22, please delete "power" and insert -- powers -- therefor;

Column 12, Line 17, please delete "OES" and insert -- optical emission spectrometry -- therefor;

In the Claims:

Column 12, Claim 3, Line 60, please delete "including" and insert -- includes -- therefor;

Column 13, Claim 7, Line 7, please delete "is" and insert -- are -- therefor.